United States Patent
Cada

(10) Patent No.: US 10,996,254 B2
(45) Date of Patent: May 4, 2021

(54) SELF-TEST FOR A PIEZOELECTRIC DEVICE

(71) Applicant: HONEYWELL INTERNATIONAL INC., Morris Plains, NJ (US)

(72) Inventor: David Cada, Morris Plains, NJ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 140 days.

(21) Appl. No.: 16/269,788

(22) Filed: Feb. 7, 2019

(65) Prior Publication Data

US 2019/0250200 A1    Aug. 15, 2019

(30) Foreign Application Priority Data

Feb. 12, 2018 (EP) .................................. 18156383

(51) Int. Cl.
*G01R 29/22* (2006.01)
*G01H 3/00* (2006.01)
(Continued)

(52) U.S. Cl.
CPC ............. *G01R 29/22* (2013.01); *G01H 3/005* (2013.01); *G01R 31/01* (2013.01);
(Continued)

(58) Field of Classification Search
CPC ...... G01K 11/24; G01K 7/006; G06F 3/0237; G01D 21/00; G01D 5/12; G01D 18/00;
(Continued)

(56) References Cited

U.S. PATENT DOCUMENTS 3,786,348 A * 1/1974 Lynas ................... G01H 1/003
324/727
5,447,051 A    9/1995 Hanks et al.
(Continued)

FOREIGN PATENT DOCUMENTS

EP     0945732 A2    9/1999
WO    95/06259 A1    3/1995

OTHER PUBLICATIONS

Extended European Search Report for Application No. 18156383.4, dated Aug. 24, 2018.

*Primary Examiner* — Vinh P Nguyen
(74) *Attorney, Agent, or Firm* — Alston & Bird LLP

(57) ABSTRACT

Apparatus and associated methods relate to a functional self-test, including (1) generation of an excitation signal, (2) applying the excitation signal to a unit under test (UUT), the excitation signal including a cyclical signal for a first interval and substantially zero signal for a second interval, (3) determining frequency content of a UUT response signal, and (4) generating a fail result in response to the frequency content below a predetermined threshold. In an illustrative example, the UUT may be a piezoelectric element (PE). The UUT response signal may be processed by a filter, for example. A portion of the filtered UUT response signal, responding to the second interval of the excitation signal, may be analyzed by a fast Fourier transform module (FFTm), for example. In various implementations, the functional self-test may advantageously determine the health of a piezoelectric gas sensing element, periodically, in a field-deployed implementation.

15 Claims, 4 Drawing Sheets

(51) Int. Cl.
*G01R 31/28* (2006.01)
*G01R 31/01* (2020.01)
*G01H 11/08* (2006.01)

(52) U.S. Cl.
CPC ......... *G01R 31/2836* (2013.01); *G01H 11/08* (2013.01); *G01R 31/2829* (2013.01)

(58) Field of Classification Search
CPC .......... G01H 13/00; G01H 3/04; G01H 11/08; G01H 1/006; G01H 3/005; G01L 5/0052; G01R 31/367; G01R 31/3842; G01R 31/385; G01R 31/389; G01R 31/392; G01R 33/0354; G01R 29/22; G01R 31/2829; G01R 31/2843; G01R 31/2884; G01R 31/28; G01R 21/2836; G01R 31/01; G09B 19/0038; G01P 21/00; H01L 41/04

See application file for complete search history.

(56) References Cited

U.S. PATENT DOCUMENTS

| | | | | |
|---|---|---|---|---|
| 6,111,335 | A * | 8/2000 | Acatrinei | G01R 29/22 310/316.03 |
| 6,556,028 | B1 * | 4/2003 | Umanskiy | G01R 29/22 324/727 |
| 7,042,228 | B2 * | 5/2006 | Lally | G01S 7/52004 324/527 |
| 8,401,820 | B2 * | 3/2013 | Jensen | G01H 11/08 702/182 |
| 2004/0194532 | A1 | 10/2004 | Lally et al. | |
| 2010/0088067 | A1 | 4/2010 | Jensen et al. | |
| 2019/0170813 | A1 * | 6/2019 | Franchitti | H01L 22/34 |

* cited by examiner

SELF-TEST FOR A PIEZOELECTRIC DEVICE

CROSS-REFERENCE TO RELATED APPLICATIONS

This application claims the benefit of European Patent Application No. 18156383.4 filed Feb. 12, 2018, the disclosure of which is herein incorporated by reference in its entirety.

TECHNICAL FIELD

Various embodiments relate generally to end-product self-tests.

BACKGROUND

Product manufacturers generally establish and follow quality systems, which may help them meet or exceed governmental requirements. In some instances, product manufacturer may qualify products before shipment to end customers to ensure the products meet design specifications and to produce product consistency. For example, products such as food, drugs, and medical devices may be subject to the Food and Drug Administration's (FDA's) quality regulations. For safety systems, including products such as safety glasses, helmets, and steel-toed shoes, the Occupational Health and Safety Administration (OSHA) may enforce various worker safety regulations. Manufacturers of safety equipment may perform various tests to ensure the products being shipped are meeting or exceeding the applicable safety regulations.

Once in the field, safety devices may be tested periodically to ensure an effective level of safety. For example, high voltage line maintenance crews may employ various insulative devices, such as rubber gloves and rubber safety mats. These devices may be systematically circulated through a safety department and may be tested to ensure their safety margins have not been compromised. In some examples, the device itself may incorporate a self-test to gain end-user confidence that the device is operating effectively. For example, a ground fault circuit interrupter (GFCI) may incorporate a test button, that the end-user may press to determine proper operation.

SUMMARY

Apparatus and associated methods relate to a functional self-test, including (1) generation of an excitation signal, (2) applying the excitation signal to a unit under test (UUT), the excitation signal including a cyclical signal for a first interval and substantially zero signal for a second interval, (3) determining frequency content of a UUT response signal, and (4) generating a fail result in response to the frequency content below a predetermined threshold. In an illustrative example, the UUT may be a piezoelectric element (PE). The UUT response signal may be processed by a filter, for example. A portion of the filtered UUT response signal, responding to the second interval of the excitation signal, may be analyzed by a fast Fourier transform module (FFTm), for example. In various implementations, the functional self-test may advantageously determine the health of a piezoelectric gas sensing element, periodically, in a field-deployed implementation.

Various embodiments may achieve one or more advantages. For example, various functional self-tester modules may increase user confidence of the safety measures employed by various gas sensing instruments. Some implementations may be independent of a piezoelectric element's acoustical properties, and as such may be performed independent of audio transducers (e.g., speakers, microphones). Various implementations may be compact, which may be advantageously implemented in small, light-weight portable instruments. The piezoelectric gas sensing elements, when subjected to the excitation signal, may advantageously produce a ringing waveform with a signal-to-noise ratio (SNR) greater than 3 dB, producing highly reliable results. Some examples of the self-test modules may be implemented cost-effectively and space-efficiently when leveraging existing instrument hardware.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, various exemplary piezoelectric element functional self-test modules in block diagram form are briefly introduced with reference to FIGS. 1, 2 and 3. Next, with reference to FIG. 4, the discussion turns to exemplary embodiments that illustrate test flow. The term "substantially zero" as used herein with reference to an excitation signal may be defined as an amplitude less than or equal to 10% of the amplitude of that portion of the excitation signal containing a cyclical waveform.

Figure 1:
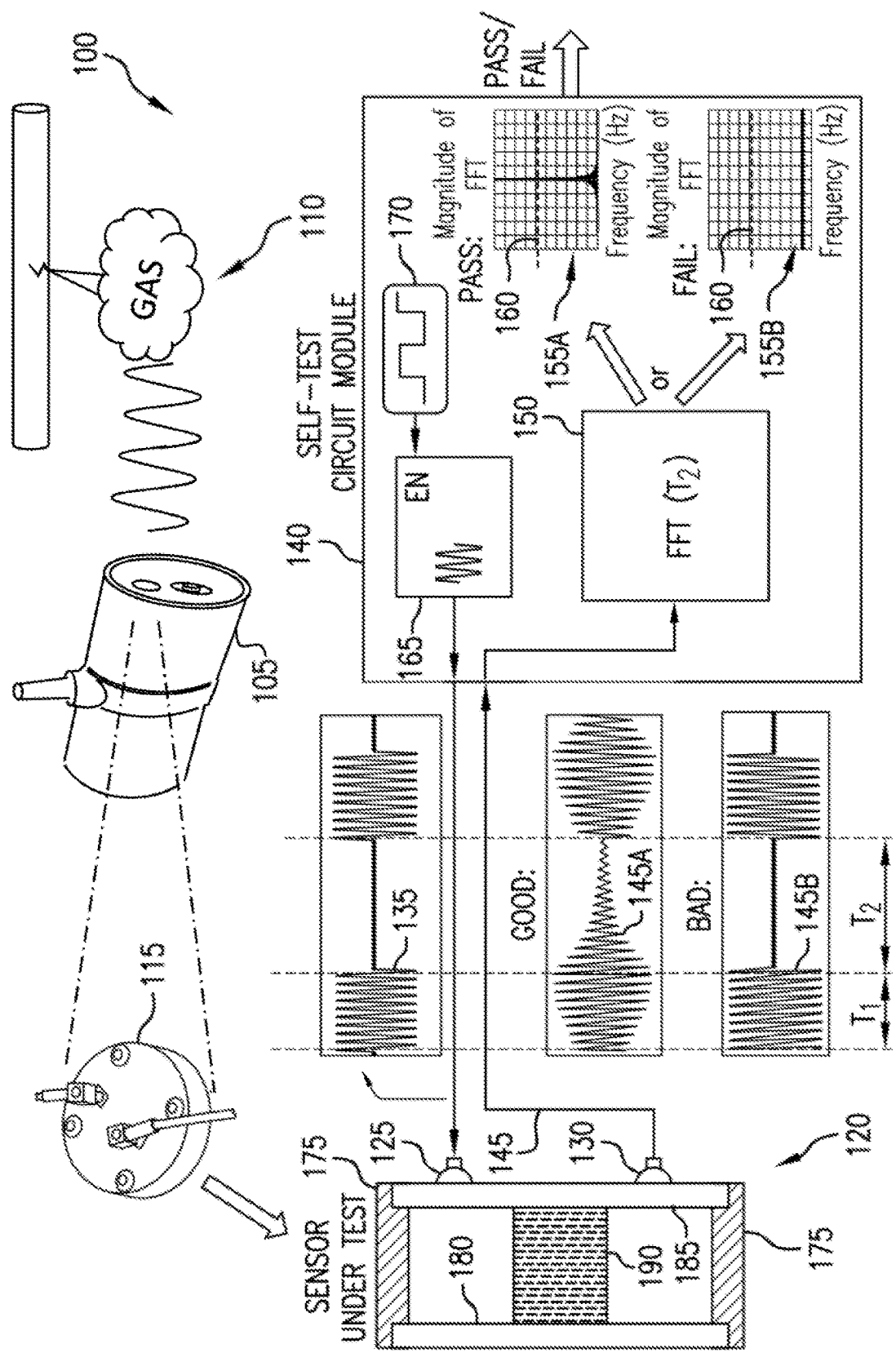
FIGS. 1, 2 and 3 depict a block diagrams of an exemplary piezoelectric element functional self-test modules, each module generating an excitation signal and producing a time-to-frequency conversion from a received piezoelectric element response signal during an interval immediately after excitation, the module producing a pass/fail result based on the conversion signal crossing a predetermined threshold.

FIG. 1 depicts a block diagram of an exemplary piezoelectric element functional self-test module, the module generating an excitation signal and determining a fast Fourier transform (FFT) result from a received piezoelectric element response signal during an interval immediately after excitation, the module producing a pass/fail result based on the FFT crossing a predetermined threshold. A gas sensor use and test example 100 includes a gas sensor high level assembly (HLA) 105. The HLA 105 is depicted sensing an ambient gas 110. The HLA 105 includes a gas sensor module 115. The gas sensor module 115 includes a gas sensor element 120, which may be referred to as a unit under test (UUT). The gas sensor element 120 includes an input terminal 125 and an output terminal 130. The input terminal 125 is driven by an excitation signal 135. The excitation signal 135 is driven by a self-test circuit module 140. In some examples, the self-test circuit module 140 may be a self-test module (STM). In response to the excitation signal 135, the gas sensor element 120 produces a response signal 145. The response signal 145 is driven out of the output terminal 130. The response signal 145 is coupled to the self-test circuit module 140. In various examples, the input terminal 125 may be a test terminal.

The self-test circuit module 140 includes an FFT conversion process 150. The FFT conversion process 150 produces a first FFT result 155A, or a second FFT result 155B. The FFT results 155A, 155B may be compared to a predetermined threshold 160. In an illustrative example, the acceptable first FFT result 155A (e.g., pass) may be determined by the self-test circuit module 140 when at least a portion (e.g., peak) of the first FFT result 155A crosses the predetermined threshold 160. Conversely, the unacceptable second FFT result 155B (e.g., fail) may be determined by the self-test circuit module 140 when the second FFT result 155B fails to cross the predetermined threshold 160.

The FFT results 155A, 155B may be produced in response to time-domain response signals 145A and 145B, respectively. In an illustrative example, the gas sensor element 120 may produce the acceptable time-domain response signal 145A. As depicted in time interval $T_1$, the acceptable time-domain response signal 145A increases in amplitude as the excitation signal 135 is applied. In time interval $T_2$ when the excitation signal 135 is gated off, the acceptable time-domain response signal 145A follows a damped natural frequency of the piezoelectric element.

A natural frequency of the piezoelectric element is that frequency at which the piezoelectric element oscillates when external forces are removed. For example, when a forcing function is applied to the piezoelectric element, then removed, the piezoelectric element may continue to oscillate at its natural frequency for a time dependent on a damping function. The forcing function may be a function that initially sets the piezoelectric element into oscillation. The damping function is an exponentiation decay, which may be dependent upon physical properties of the piezoelectric element, the mounting properties, and the properties of the medium surrounding the piezoelectric element. A natural frequency band may be defined as a spectrum of expected natural frequencies of piezoelectric elements. In some examples, the natural frequency band may include a wider spectrum of frequencies to account for various tolerances (e.g., manufacturing variance, temperature, mounting, aging, alternate sourcing). In various examples, the natural frequency may be a natural response frequency or a natural frequency response.

For example, a gas sensing instrument may be implemented with piezoelectric elements that have a range of natural frequencies of 120 KHz-250 KHz. A worst-case tolerance of the piezoelectric elements may increase this range to 100 KHz-300 KHz. A resulting natural frequency band of these implemented piezoelectric elements may be 100 KHz-300 KHz.

In a contrasting illustrative example, the gas sensor element 120 may produce the unacceptable time-domain response signal 145B. As depicted in time interval $T_1$, the unacceptable time-domain response signal 145B is a constant amplitude as the excitation signal 135 is applied. In time interval $T_2$ when the excitation signal 135 is gated off, the unacceptable time-domain response signal 145B drops to substantially zero within a time determined by damping function. The damping function for the unacceptable time-domain response signal 145B may have a time constant of less than about 50%, 45%, 40%, 35%, 30%, 25%, 20%, 15%, 10%, 5%, 4%, 3%, 2%, 1%, 0.5%, 0.25% or less than about 0.1% of the time interval $T_2$.

The frequency content (within a predetermined natural frequency band) in time interval $T_2$ of the acceptable time-domain signal 145A may include values above the predetermined threshold 160. The frequency content (within a predetermined natural frequency band) in time interval $T_2$ of the unacceptable time-domain signal 145B may include values below the predetermined threshold 160. Accordingly, the predetermined threshold 160 may be defined at a value that accepts (e.g., passes) good gas sensor elements 120, and rejects (e.g., fails) bad gas sensor elements 120.

The excitation signal 135 is generated by a function generator module 165 within the self-test circuit module 140. The function generator may produce a sinewave output. The sinewave output may advantageously apply less stress on the gas sensor element 120 because of its natural oscillation. The function generator may produce a square-wave output. The square-wave output may advantageously allow direct excitation with a digital processor (e.g., FIG. 2 implementation), and consume less space. The function generator may produce a triangle-wave output. The triangle-wave output may be implemented in a straight forward manner with resistor-capacitor (RC) timing circuits. The function generator may produce an impulse wave output. The impulse wave output may minimize test time and may conserve power.

The function generator module 165 is gated by an enable signal 170. The enable signal 170 in conjunction with the function generator module 165 may combine to produce the bursting effect as illustrated in the excitation signal 135. In an illustrative example, an active function (e.g., sine, square, triangle, impulse) of the function generator module 165 may appear on the excitation signal 135 at time interval $T_1$ when the enable signal 170 is active. Further, a substantially zero output may appear on the excitation signal 135 at time interval $T_2$ when the enable signal 170 is inactive.

The gas sensor element 120 includes a frame 175. The frame 175 holds a brass membrane 180 and a printed circuit board (PCB) 185. In various examples, the piezoelectric element may be a piezoelectric element. A crystal 190 is sandwiched between the brass membrane 180 and the PCB 185. In some examples, the crystal 190 may be a piezoelectric crystal. The PCB 185 is fixedly coupled to the input terminal 125 and the output terminal 130.

Figure 2:
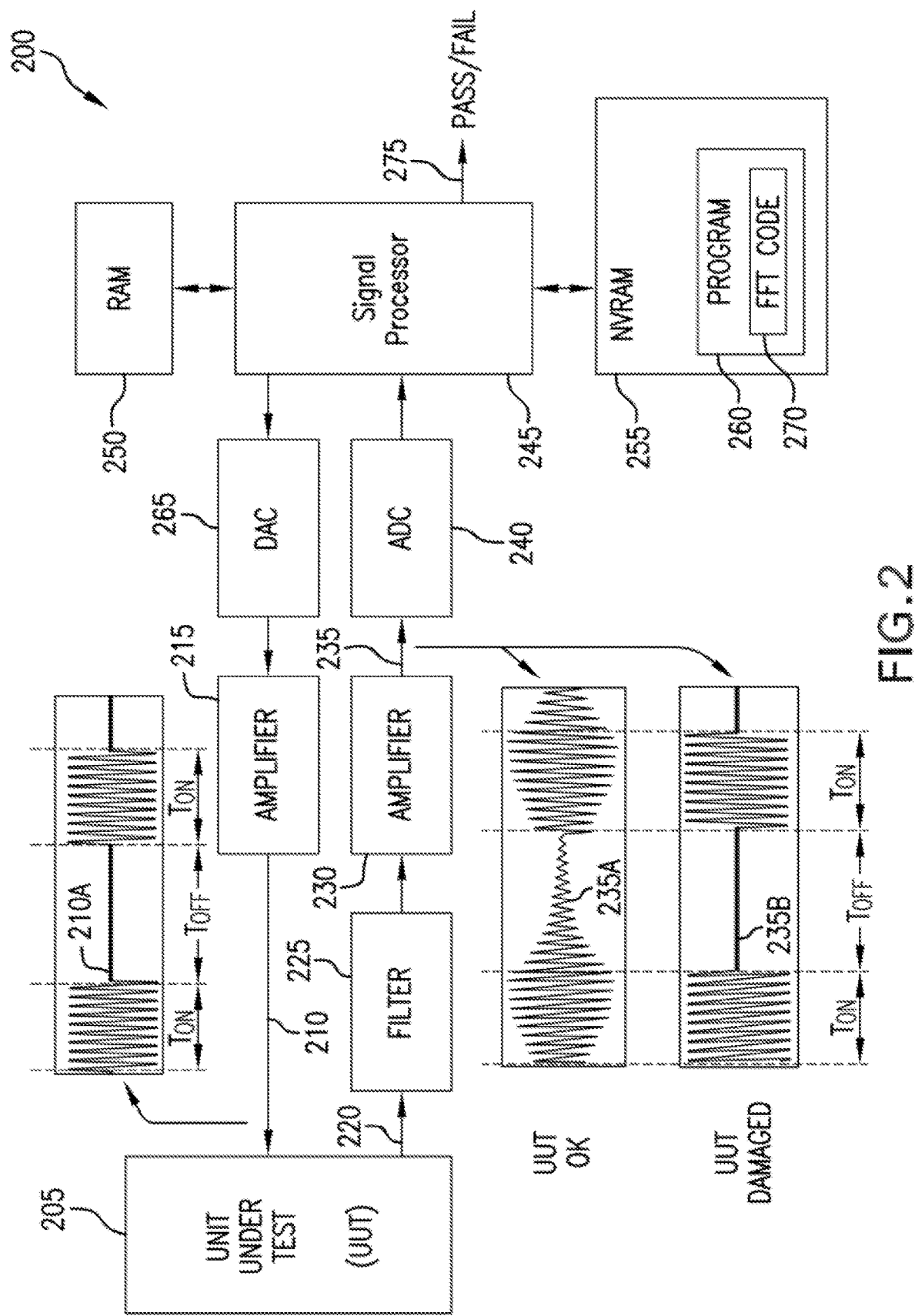

FIG. 2 depicts a block diagram of an exemplary piezoelectric element functional self-test module, the module generating an excitation signal and determining a time-to-frequency conversion from a received piezoelectric element response signal during an interval immediately after excitation, the module producing a pass/fail result based on the conversion crossing a predetermined threshold. A gas sensor self-test configuration 200 includes a unit under test (UUT) 205. The UUT 205 is driven by an excitation signal 210. The excitation signal 210 is driven by an amplifier 215. In response to the excitation signal 210, the UUT 205 produces a response signal 220. The response signal 220 is coupled to a filter 225.

In various examples, the filter 225 may be an averaging filter. The averaging filter may be included in software in an advantageously straight forward implementation. In some implementations, the filter 225 may be a low-pass filter. The low-pass filter may be implemented cost-effectively in hardware. The filter 225 filters various electrical noise that may corrupt the response signal 220. The signal output from the filter 225 feeds an amplifier 230. The amplifier 230 produces a resulting amplified signal 235. The amplified signal 235 feeds an analog-to-digital converter (ADC) 240, which produces a digital output representative of a filtered and scaled time-domain value of the response signal 220. The digital output of the ADC 240 is read by a signal processor 245.

The signal processor 245 is part of a computing system which includes a (volatile) random-access memory (RAM) 250 and a non-volatile random-access memory NVRAM 255. The NVRAM 255 includes a program memory 260. The signal processor 245 may read from and write to the RAM 250. The signal processor 245 may read from the NVRAM 255 and the program memory 260. The signal processor 245 may read and execute preprogrammed instructions from the program memory 260.

The signal processor 245 generates streaming data to a digital-to-analog converter (DAC) 265, the streaming data representing a scaled version of the excitation signal 210. The DAC 265 generates an analog waveform in response to the data values coming from the signal processor 245. The analog waveform out of the DAC 265 feeds the input to the amplifier 215.

The excitation signal 210 is represented by an exemplary excitation waveform 210A. The excitation waveform 210A is directed by the signal processor 245, produced by the DAC 265 and scaled by the amplifier 215. In the depicted example, the excitation waveform 210A is made up of two intervals $T_{ON}$ and $T_{OFF}$, which repeat in an alternating fashion.

The signal processor 245 may include an FFT code module 270. In various examples, the signal processor 245 may execute the preprogrammed instructions in the FFT code module 270. This code execution may convert the digital output of the ADC 240 (during a time interval $T_{OFF}$) to frequency domain values. The signal processor 245 may produce a signal output 275 in response to the amplitude of the frequency domain values.

In some examples, a self-test module (STM) may include the signal processor 245, the RAM 250, the NVRAM 255 (including the program memory 260 and the FFT code module 270), the ADC 240, the DAC 265, the amplifiers 215, 235, the filter 225 and the UUT 205. The STM may include the excitation waveform 210A and the pass/fail signal output 275.

In an illustrative example, a known good UUT 205 outputs a response signal, such as response signal 220 in response to the applied excitation waveform 210A. Once filtered through the filter 224 and amplified through the amplifier 230 the response may resemble a waveform 235A. The waveform 235A couples through the ADC 240 to the signal processor 245. The signal processor 245 executing preprogrammed instructions from the FFT code module 270 converts the $T_{OFF}$ portion of the waveform 235A into a frequency domain conversion. In the depicted example of FIG. 2, the waveform 235A includes a damped ring-wave in the $T_{OFF}$ portion of the waveform 235A. Accordingly, the frequency domain response (within a predetermined natural frequency band) of the $T_{OFF}$ portion of the waveform 235A, may be greater than a predetermined threshold, in the frequencies centered about the fundamental frequency of the ring-wave. In response to frequency domain values (within a predetermined natural frequency band) greater than a predetermined threshold, the signal processor 245 may generate a PASS result to the signal output 275. In various implementations, the PASS result may correspond to a qualified (e.g., good, functional, acceptable) UUT 205.

In an illustrative example, a known bad UUT 205 outputs a response signal, such as response signal 220, in response to the applied excitation waveform 210A. Once filtered through the filter 224 and amplified through the amplifier 230 the response may resemble a waveform 235B. The waveform 235B couples through the ADC 240 to the signal processor 245. The signal processor 245 executing preprogrammed instructions from the FFT code module 270 converts the $T_{OFF}$ portion of the waveform 235B into a frequency domain conversion. In the depicted example of FIG. 2, the waveform 235B includes a substantially zero signal in the $T_{OFF}$ portion of the waveform 235B. Accordingly, the frequency domain response (within a predetermined natural frequency band) of the $T_{OFF}$ portion of the waveform 235B, may not contain frequency content greater than the predetermined threshold. In response to frequency domain values (within a predetermined natural frequency band) less than the predetermined threshold, the signal processor 245 may generate a FAIL result to the signal output 275. In various implementations, the FAIL result may correspond to a disqualified (e.g., bad, damaged, non-functional, unacceptable, defective) UUT 205.

Figure 3:
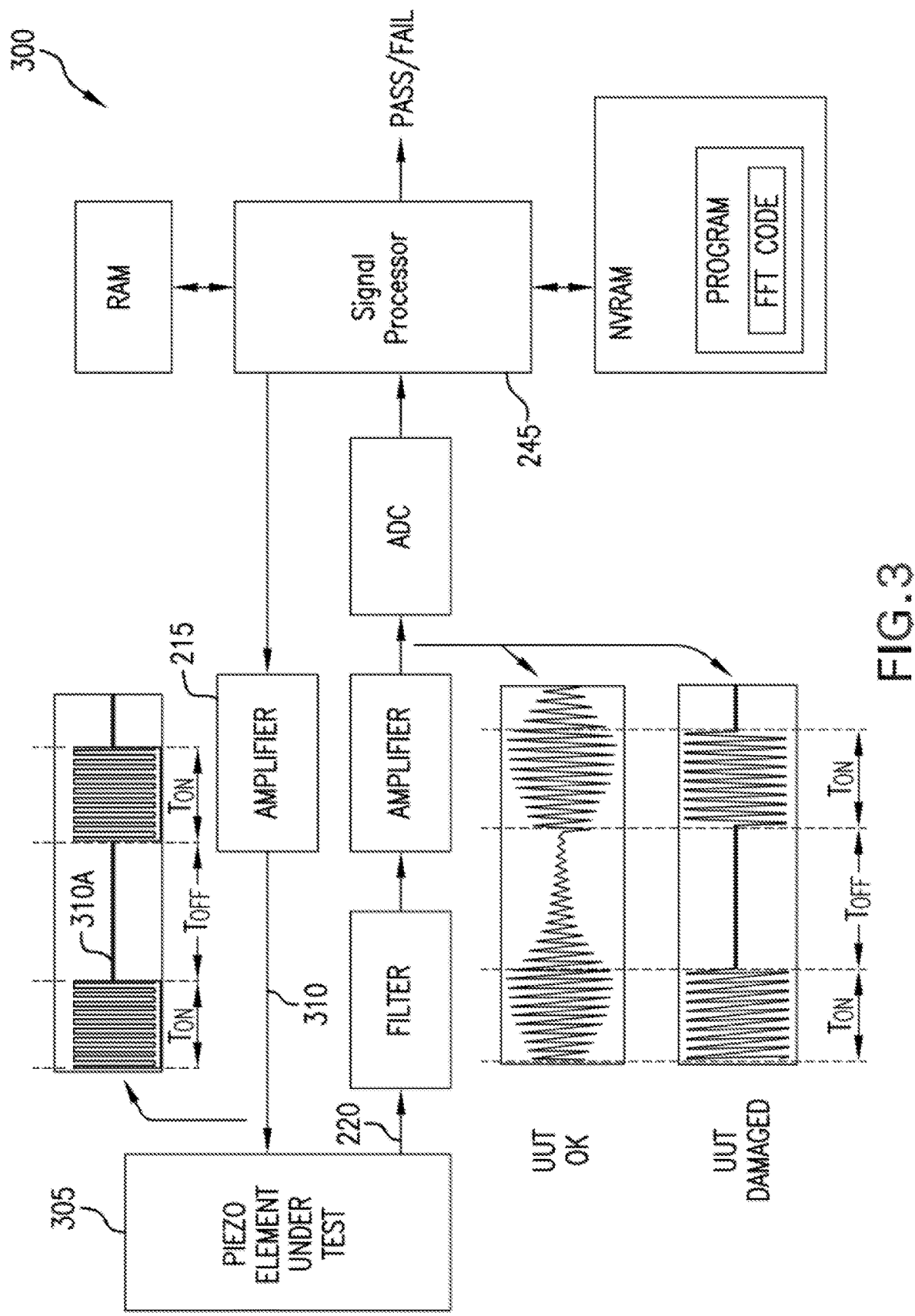

FIG. 3 depicts a block diagram of an exemplary piezoelectric element functional self-test module, the module generating an excitation signal and producing a time-to-frequency conversion from a received piezoelectric element response signal during an interval immediately after excitation, the module producing a pass/fail result based on the time-to-frequency conversion crossing a predetermined threshold. In the depicted example, a piezoelectric element test setup 300 includes a piezoelectric element 305 under test. The piezoelectric element 305 is driven by an excitation signal 310 via the amplifier 215. In response to the excitation signal 310, the piezoelectric element 305 produces the response signal 220.

The signal processor 245 directly generates a scaled version of the excitation signal 310. The signal processor 245 generates a burst square wave as depicted in the exemplary waveform 310A. With the exception of the square wave excitation signal and the generation thereof, the remaining functionality of FIG. 3 follows the description with reference to FIG. 2.

Figure 4:
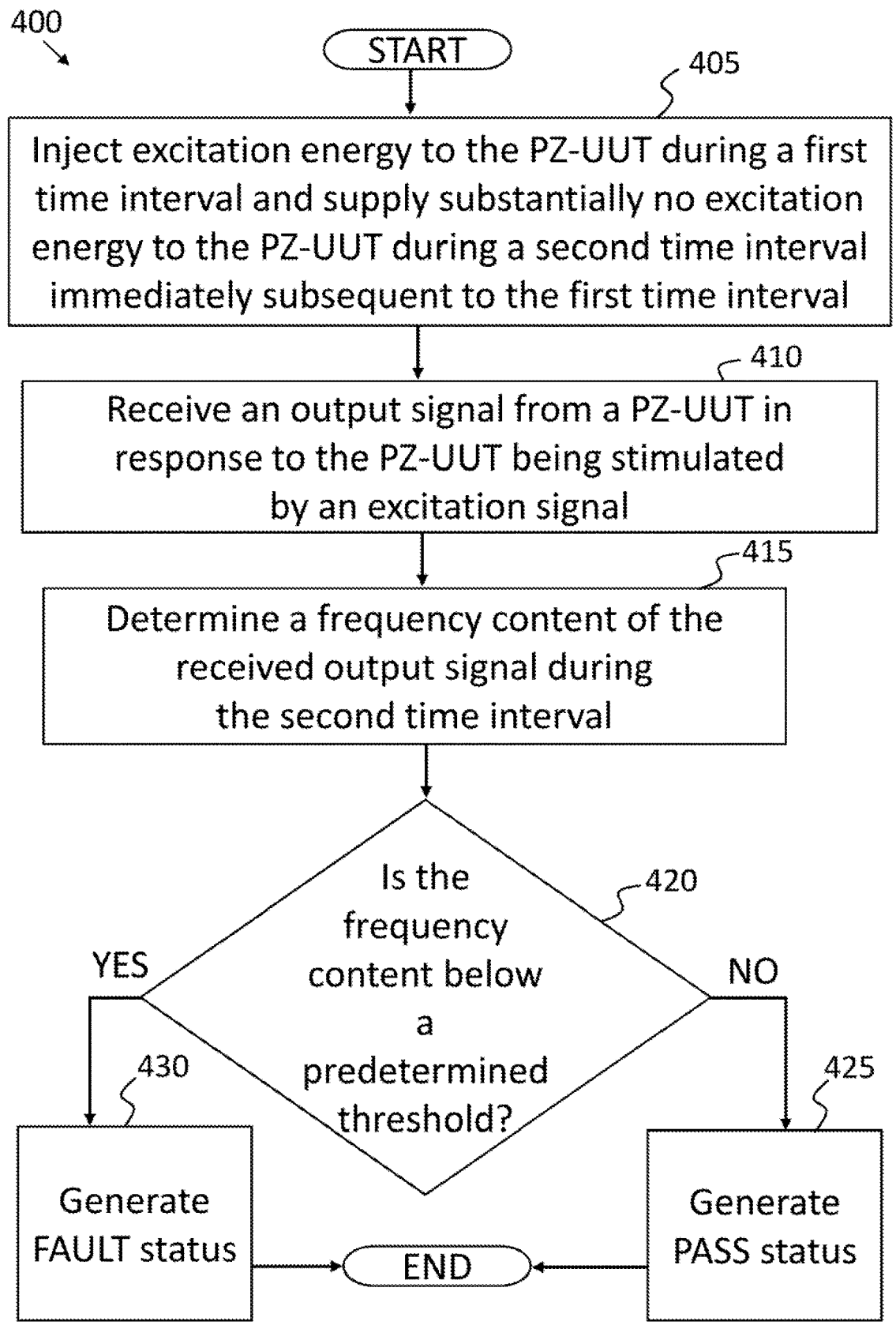
FIG. 4 depicts a flowchart of an exemplary piezoelectric element functional self-test module.

FIG. 4 depicts a flowchart of an exemplary piezoelectric element functional self-test circuit module. A self-test module (STM) may be adapted to couple to an output port of a piezoelectric Unit Under Test (PZ-UUT). The STM may execute a self-test program 400 including preprogramed instruction beginning at step 405. At step 405 the self-test program 400 injects excitation energy to the PZ-UUT during a first time-interval and supplies substantially no excitation energy to the PZ-UUT during a second time-interval immediately subsequent to the first interval. Execution continues to a step 410. At step 410 the self-test program 400 receives an output signal from the PZ-UUT in response to the PZ-UUT being stimulated by an excitation signal. Execution continues to step 415. At step 415, the self-test program 400 determines, with the STCM, a frequency content of the received output signal during the second time-interval. In some examples, the self-test program 400 may produce an FFT from the received output signal during the second time-interval. Execution continues to step 420. At step 420, the self-test program 400 compares the frequency content at a predetermined comparison time during the second time-interval to a predetermined threshold amplitude. If the frequency content at a predetermined comparison time during the second time-interval is above a predetermined threshold amplitude, then execution proceeds to step 425, where the self-test program 400 generates a PASS result, and the self-test program 400 is exited. If the frequency content at a predetermined comparison time during the second time-interval is below a predetermined threshold amplitude, then execution jumps to step 430, where the self-test program 400 generates a FAULT (e.g., FAIL) result, and the self-test program 400 is exited.

Although various embodiments have been described with reference to the figures, other embodiments are possible. For example, sine bursts may be directed by a processor, produced by a converter and driven by an amplifier. The test bursts may be injected into a piezoelectric gas sensor subassembly. The piezoelectric gas sensor subassembly may be configured to receive the sine bursts and capacitively couple them to a piezoelectric membrane within the piezoelectric gas sensor subassembly. Between test bursts, a response from the output of the piezoelectric gas sensor subassembly may be sent to an ADC then captured by the processor. In various examples of properly functioning piezoelectric gas sensor subassemblies, a ringing signal may damp out very slowly and may produce an FFT (within a predetermined natural frequency band) above a predetermined threshold. In various examples of defective piezoelectric gas sensor subassemblies, the ringing may damp out very rapidly producing an FFT (within a predetermined natural frequency band) below a predetermined threshold. The processor module may produce a PASS result for the FFT (within a predetermined natural frequency band) above the predetermined threshold and may produce a FAIL result for the FFT (within a predetermined natural frequency band) at or below the predetermined threshold. In some examples, the pass/fail result may be a pass/fail indication.

Various test method implementations may accommodate testing an ultrasonic sensor (e.g., a piezoelectric sensor) within a gas detection instrument (e.g., HLA 105), without instrument disassembly. The test may involve sending an input signal (e.g., burst of sinusoidal waves) to the ultrasonic sensor and evaluating the frequency response of the piezoelectric sensor in-between two bursts of the input signal. If the noise-reduced response includes a signal (e.g., ringing signal) in-between two bursts, then the frequency response may exceed a predetermined threshold (within a predetermined natural frequency band). The tester may determine a passing result in response to the frequency response exceeding the predetermined threshold (within a predetermined natural frequency band). In some examples, the passing result may indicate that the ultrasonic sensor is operating efficiently. Accordingly, the tester may determine a failing result in response to the frequency response remaining below the predetermined threshold (within a predetermined natural frequency band). In some examples, the failing result may indicate that the ultrasonic sensor is operating inefficiently.

In some implementations, the signal processor 245, the RAM 250, the NVRAM 255, the ADC 240 and/or the DAC 265 may be implemented in existing hardware circuits. For example, an end-product (e.g., HLA 105) may include various hardware to implement its essential performance. The various hardware may include one or more processors, RAMs, NVRAMs, ADCs and/or DACs. In addition to the essential performance (e.g., sensing gas), the end-product may also implement a self-test function. The implementation of the self-test function may use one or more of the various hardware described, leveraging those existing various hardware resources to perform its function. For example, a microcontroller on an existing gas detector instrument may be additionally programmed to perform the excitation signal generation, the FFT function, the threshold detection and the pass/fail output functions. Further, a detected failure may display a warning message on the end-product display. In some examples, a detected failure may display a warning light. The warning light may be advantageous in various dark environments. In some examples, a detected failure may provide haptic (e.g., vibrational) feedback. The vibrational feedback may be advantageous in audibly noisy environments, or in environments where light and sound may be objectionable (e.g., movie theatres, churches). In some examples, a detected failure may provide an audible alert. The audible alert may be advantageous in situations where the end-product is not in sight or not a constant visual focus (e.g., in a pocket, around a neck or wrist).

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

In various examples, a test method may include: (1) producing a digital stream representing an excitation function characterized by a sine wave gated with off times during an interval $T_2$, (2) receiving data from an ADC, representing the UUT response to the excitation function, (3) determining an average amplitude of a natural frequency from the received data during an interval $T_2$, (4) comparing the average amplitude result to a predetermined threshold during the interval $T_2$, (5) determining a fail result when the average amplitude result is below the predetermined threshold, and (6) determining a pass result when the average amplitude result is above the predetermined threshold.

In an exemplary aspect, a test method for testing a piezoelectric device may include (1) providing a self-test circuit module (STCM) adapted to couple to an output port of a piezoelectric Unit Under Test (PZ-UUT), (2) receiving an output signal from the PZ-UUT in response to the PZ-UUT being stimulated by an excitation signal, (3) determining, with the STCM, a frequency content of the received output signal during the second time interval, (4) comparing, with the STCM, the determined frequency content at a predetermined comparison time during the second time interval to a predetermined threshold amplitude. If the determined frequency content is less than the predetermined threshold amplitude, then the test method may generate a status signal indicative of a fault in the PZ-UUT. The STCM may include a processor configured to control the application of the excitation signal to the PZ-UUT during the first time-interval. The processor may be configured to disable the supply of the excitation signal to the PZ-UUT during the second time-interval. The processor may be configured to cause the generation of the excitation signal using a digital-to-analog converter (DAC).

The test method for testing a piezoelectric device may include an amplifier circuit coupled to the DAC. The amplifier may be configured to amplify an output of the DAC to generate the injected excitation energy to the PZ-UUT. The received output signal from the PZ-UUT during the second time-interval may include a non-oscillating natural response waveform. The predetermined comparison time may be less than about 100, 90, 80, 70, 60, 50, 40, 30, 20, or less than about 10 periods of the periodic excitation signal after the start of the second time-interval.

The excitation signal may be periodic during the first time-interval. The frequency of the excitation signal may be defined by an inverse of a period of the periodic excitation signal. The inverse of the period of the periodic excitation signal may be within one percent of a natural response frequency of the PZ-UUT.

The test method for testing a piezoelectric device may include providing an averaging filter. The averaging filter may be coupled between the PZ-UUT and the STCM. The averaging filter may be configured to filter the received output signal.

In an exemplary aspect, a test apparatus for testing a piezoelectric device may include a self-test circuit module (STCM) adapted to couple to an output port of a piezoelectric Unit Under Test (PZ-UUT). The test apparatus may also include a data store operatively coupled to the STCM and may contain a program of instructions that, when executed by the STCM, may cause the STCM to perform operations to evaluate the operational integrity of the PZ-UUT. The operations may include: (1) receiving an output signal from the PZ-UUT in response to the PZ-UUT being stimulated by an excitation signal, (2) determining, with the STCM, a frequency content amplitude of the received output signal during the second time interval, (3) comparing, with the STCM, the determined frequency content amplitude at a predetermined comparison time during the second time interval to a predetermined threshold amplitude. If the determined frequency content is less than the predetermined threshold amplitude, then the test method may generate a status signal indicative of a fault in the PZ-UUT. The STCM may include a processor operable to execute the program of instructions.

In an exemplary aspect, a test apparatus for testing a piezoelectric device may include a self-testing module (STM) and a piezoelectric Unit Under Test (PZ-UUT). The test apparatus may also include a data store operatively coupled to the STM and may contain a program of instructions that, when executed by the STM, may cause the STM to perform operations to evaluate the operational integrity of the PZ-UUT. The operations may include: (1) receiving an output signal from the PZ-UUT in response to the PZ-UUT being stimulated by an excitation signal, (2) determining, with the STM, a frequency content amplitude of the received output signal during the second time interval, (3) comparing, with the STM, the determined frequency content amplitude at a predetermined comparison time during the second time interval to a predetermined threshold amplitude. If the determined frequency content is less than the predetermined threshold amplitude, then the test method may generate a status signal indicative of a fault in the PZ-UUT. The STM may execute the program of instructions. The operations may include controlling the application of the excitation signal to the PZ-UUT during the first time-interval.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A method for testing a piezoelectric device, the method comprising:
providing a self-test circuit module (STCM) adapted to couple to an output port of a piezoelectric Unit Under Test (PZ-UUT);
receiving an output signal from the PZ-UUT in response to the PZ-UUT being stimulated by an excitation signal, the excitation signal:
(a) injecting excitation energy to the PZ-UUT during a first time-interval (T1), and
(b) supplying substantially no excitation energy to the PZ-UUT during a second time-interval (T2) immediately subsequent to the first time-interval (T1);
determining, with the STCM, a frequency content of the received output signal during the second time-interval (T2);
comparing, with the STCM, the frequency content at a predetermined comparison time during the second time-interval (T2) to a predetermined threshold amplitude; and
if the frequency content is less than the predetermined threshold amplitude, then generating a status signal indicative of a fault in the PZ-UUT, wherein the STCM further comprises a processor configured to control application of the excitation signal to the PZ-UUT during the first time-interval (T1), and the processor is further configured to cause the generation of the excitation signal using a digital-to-analog converter (DAC).

2. The method of claim 1, wherein the processor is further configured to disable the supplying of the excitation signal to the PZ-UUT during the second time-interval (T2).

3. The method of claim 1, wherein the STCM further comprises an amplifier circuit coupled to the DAC and configured to amplify an output of the DAC to generate the excitation energy to the PZ-UUT.

4. The method of claim 1, further comprising receiving the output signal from the PZ-UUT during the second time-interval (T2) in the form of a non-oscillating natural response waveform.

5. The method of claim 1, wherein the predetermined comparison time is less than 100 periods of the excitation signal after a start of the second time-interval (T2).

6. The method of claim 1, wherein the predetermined comparison time is less than 50 periods of the excitation signal after a start of the second time-interval (T2).

7. The method of claim 1, wherein predetermined comparison time is less than 10 periods of the excitation signal after start of the second time-interval (T2).

8. A test method for testing a piezoelectric device, the method comprising:
providing a self-test circuit module (STCM) adapted to couple to an output port of a piezoelectric Unit Under Test (PZ-UUT);
receiving an output signal from the PZ-UUT in response to the PZ-UUT being stimulated by an excitation signal, the excitation signal:
(a) injecting excitation energy to the PZ-UUT during a first time-interval (T1), and
(b) supplying substantially no excitation energy to the PZ-UUT during a second time-interval (T2) immediately subsequent to the first time-interval (T1);
determining, with the STCM, a frequency content of the received output signal during the second time-interval (T2);
comparing, with the STCM, the frequency content at a predetermined comparison time during the second time-interval (T2) to a predetermined threshold amplitude; and
if the frequency content is less than the predetermined threshold amplitude, then generating a status signal indicative of a fault in the PZ-UUT, wherein the excitation signal is periodic during the first time-interval (T1), and a frequency defined by an inverse of a period of the excitation signal is within one percent of a natural response frequency of the PZ-UUT.

9. A test method for testing a piezoelectric device, the method comprising:
providing a self-test circuit module (STCM) adapted to couple to an output port of a piezoelectric Unit Under Test (PZ-UUT);
receiving an output signal from the PZ-UUT in response to the PZ-UUT being stimulated by an excitation signal, the excitation signal:
(a) injecting excitation energy to the PZ-UUT during a first time-interval (T1), and
(b) supplying substantially no excitation energy to the PZ-UUT during a second time-interval (T2) immediately subsequent to the first time-interval (T1);
determining, with the STCM, a frequency content of the received output signal during the second time-interval (T2);
comparing, with the STCM, the frequency content at a predetermined comparison time during the second time-interval (T2) to a predetermined threshold amplitude;
if the frequency content is less than the predetermined threshold amplitude, then generating a status signal indicative of a fault in the PZ-UUT; and providing an averaging filter coupled between the PZ-UUT and the STCM, the averaging filter configured to filter the received output signal.

10. A test apparatus for testing a piezoelectric device, the apparatus comprising:
a self-test circuit module (STCM) adapted to couple to an output port of a piezoelectric Unit Under Test (PZ-UUT);
a data store operatively coupled to the STCM and containing a program of instructions that, when executed by the STCM, cause the STCM to perform operations to evaluate operational integrity of the PZ-UUT, the operations comprising:
receiving an output signal from the PZ-UUT in response to the PZ-UUT being stimulated by an excitation signal, the excitation signal:
(a) injecting excitation energy to the PZ-UUT during a first time-interval (T1), and
(b) suppling substantially no excitation energy to the PZ-UUT during a second time-interval (T2) immediately subsequent to the first time-interval (T1);
determining, with the STCM, a frequency content of the received output signal during the second time-interval (T2);
comparing, with the STCM (140), the frequency content at a predetermined comparison time during the second time-interval (T2) to a predetermined threshold amplitude; and, if the frequency content is less than the predetermined threshold amplitude, then generate a status signal indicative of a fault in the PZ-UUT, wherein the STCM further comprises a processor operable to execute the program of instructions, wherein the operations comprise causing the generation of the excitation signal using a digital-to-analog converter (DAC).

11. The apparatus of claim 10, wherein the operations further comprise: control application of the excitation signal to the PZ-UUT during the first time-interval (T1).

12. The apparatus of claim 11, wherein the operations further comprise: disable the supplying of the excitation signal to the PZ-UUT during the second time-interval (T2).

13. The apparatus of claim 10, further comprising an amplifier circuit coupled to the DAC and configured to amplify an output of the DAC to generate the injected excitation energy to the PZ-UUT.

14. A test apparatus for testing a piezoelectric device, the apparatus comprising:
    a self-test circuit module (STCM) adapted to couple to an output port of a piezoelectric Unit Under Test (PZ-UUT);
    a data store operatively coupled to the STCM and containing a program of instructions that, when executed by the STCM, cause the STCM to perform operations to evaluate operational integrity of the PZ-UUT, the operations comprising:
        receiving an output signal from the PZ-UUT in response to the PZ-UUT being stimulated by an excitation signal, the excitation signal:
            (a) injecting excitation energy to the PZ-UUT during a first time-interval (T1), and
            (b) suppling substantially no excitation energy to the PZ-UUT during a second time-interval (T2) immediately subsequent to the first time-interval (T1);
        determining, with the STCM, a frequency content of the received output signal during the second time-interval (T2);
        comparing, with the STCM, the frequency content at a predetermined comparison time during the second time-interval (T2) to a predetermined threshold amplitude; and,
    if the frequency content is less than the predetermined threshold amplitude, then generate a status signal indicative of a fault in the PZ-UUT, wherein the excitation signal is periodic during the first time-interval (T1), and a frequency defined by an inverse of a period of the excitation signal is within one percent of a natural response frequency of the PZ-UUT.

15. A test apparatus for testing a piezoelectric device, the apparatus comprising:
    a self-test circuit module (STCM) adapted to couple to an output port of a piezoelectric Unit Under Test (PZ-UUT);
    a data store operatively coupled to the STCM and containing a program of instructions that, when executed by the STCM, cause the STCM to perform operations to evaluate operational integrity of the PZ-UUT, the operations comprising:
        receiving an output signal from the PZ-UUT in response to the PZ-UUT being stimulated by an excitation signal, the excitation signal:
            (a) injecting excitation energy to the PZ-UUT during a first time-interval (T1), and
            (b) suppling substantially no excitation energy to the PZ-UUT during a second time-interval (T2) immediately subsequent to the first time-interval (T1);
        determining, with the STCM, a frequency content of the received output signal during the second time-interval (T2);
        comparing, with the STCM, the frequency content at a predetermined comparison time during the second time-interval (T2) to a predetermined threshold amplitude; and,
    if the frequency content is less than the predetermined threshold amplitude, then generate a status signal indicative of a fault in the PZ-UUT; and
    an averaging filter coupled between the PZ-UUT and the STCM, the averaging filter configured to filter the received output signal.

* * * * *